United States Patent
Crisan

[19]

[11] Patent Number: 5,911,529
[45] Date of Patent: Jun. 15, 1999

[54] TYPING POWER

[75] Inventor: Adrian Crisan, Cypress, Tex.

[73] Assignee: Compaq Computer Corporation, Houston, Tex.

[21] Appl. No.: 08/885,089

[22] Filed: Jun. 30, 1997

[51] Int. Cl.$^6$ ........................................................ B41J 5/08
[52] U.S. Cl. ............................ 400/472; 400/474; 400/490
[58] Field of Search ..................... 400/473, 474, 400/472, 490; 310/12, 15, 20

[56] References Cited

U.S. PATENT DOCUMENTS

| | | | |
|---|---|---|---|
| 5,220,318 | 6/1993 | Staley | 340/825.34 |
| 5,615,393 | 3/1997 | Kikinis et al. | 395/887 |

OTHER PUBLICATIONS

Bassak, Gil, *Running on Empty*, Mobile Computing and Communications, Jun. 1997, pp. 76–85.
Shen, Liang Chi, *Applied Electromagnetism*, PWS Engineering, 1987, Chap. 16, pp. 488–497.
MICREL Semiconductor, MIC2660, IttyBitty™ Charge Pump, MICREL Incorporated, 1996, Section 10, pp. 10–14.
MAXIM, NiCd/NiMH Battery Fast Charge Controllers, MAXIM Integrated Products, Jan. 1997, pp. 1–18.
MAXIM, MAX712 Linear–Mode Evaluation Kit, MAXIM Integrated Products, Jan. 1997, pp. 1–6.
MAXIM, MAX713 Switch–Mode Evaluation Kit, MAXIM Integrated Products, Jan. 1997, pp. 1–4.

*Primary Examiner*—John Hilten
*Attorney, Agent, or Firm*—Akin, Gump, Strauss, Hauer & Feld, LLP

[57] ABSTRACT

A keyboard power generator provides a plurality of keys with one or more magnets mounted thereon. Additionally, a plurality of coils are mounted on both ends of the magnet such that, when the user is typing, the magnet traverses the coils. The movement of the magnet over the coils causes a current to be generated. In one embodiment, one magnet is mounted per key on the keyboard. In a second embodiment, a plurality of magnets are mounted per key to enhance the power generation capability of the keyboard. The currents generated collectively by the keys are provided to a charge pump which multiplies the voltage to achieve a level greater than the voltage level of the battery to be charged. The multiplied voltage is provided to a charging circuitry such as a trickle charger to recharge the battery. In this manner, the more information entered by the user, the more electricity is generated by the keyboard power generator. The energy provided by the keyboard of the present invention can be used to lengthen the operating period of the portable computer, or alternative, can be used to reduce the size of the primary battery so as to result in a lighter portable computer.

23 Claims, 4 Drawing Sheets

TYPING POWER

BACKGROUND OF THE INVENTION

1. Field of the Invention

The present invention relates to the generation of power, and more particularly, to the generation of power using a keyboard.

2. Description of the Related Art

The advent of modern civilization is driven in part by the development of electricity. One innovation driven by the availability of electricity is the ubiquitous computer. The rapid acceptance of computer technology by corporations as well as consumers has led to the widespread use of computers. Further driving this process is the continual reduction in size and cost of personal computers.

Originally, personal computers were large items best suited for floor standing or desktop use. Eventually, they became smaller so that desktop use became the standard. Improvements in processor, memory and data storage capabilities have resulted in light weight, powerful mobile computers such as portables, luggables, laptops, notebooks, palm top and personal digital assistants. These computers can provide sufficient processing capability for audio visual applications, such as computer aided design, three dimensional animation, and multimedia presentation, even when used at remote locations.

As the use of personal computers increased, so did the desire to use computers remotely to support and increase the efficiency of mobile users. However, a continuing limiting factor has been battery life. Battery life is limited both due to limitations in battery technology as well as the power consumption levels required in a high performance notebook computer.

Although the battery can be recharged by tapping into the AC power line, such requirement restricts the mobility of the user. Further, any extension of battery life is desirable. So additional power sources provide incremental benefit: solar power cells, for example, can extend battery life, but additional power sources could even further extend the battery life. Thus, a need exists for a power generation system that can be embedded within the notebook computer in order to extend the operating period per battery recharge operation.

SUMMARY OF THE INVENTION

A system according to the present invention provides a keyboard power generator which captures energy generated by the user during the data entry process and uses the energy to charge a battery. In one embodiment, the keyboard power generator has a plurality of keys with one or more magnets mounted on the keys. Additionally, one or more coils are mounted on both ends of the magnet so that when the user types, the magnet traverses the coils. The movement of the magnet over the coils causes a current to be generated. In one embodiment, one magnet is mounted per key on the keyboard. In a second embodiment, a plurality of magnets are mounted per key to enhance the power generation capability of the keyboard. More generally, a keyboard mechanical to electrical energy converter provides power for a computer system.

The currents generated collectively by the keys are provided to a charge pump which multiplies the voltage to achieve a level greater than the voltage level of the battery to be charged. The multiplied voltage is provided to a charging circuitry such as a trickle charger or other types of charging circuitry to recharge the battery. In this manner, the more information entered by the user, the more electricity is generated by the keyboard power generator. The energy provided by the keyboard of the present invention can then be used to lengthen the operating period of the portable computer, or in the alternative, can be used to reduce the size of the primary battery so as to result in a lighter portable computer. Thus, the present invention allows longer operating period between recharge, faster processing speeds, more powerful peripherals, larger screens and other advanced features for portable computers while keeping weight and size down.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
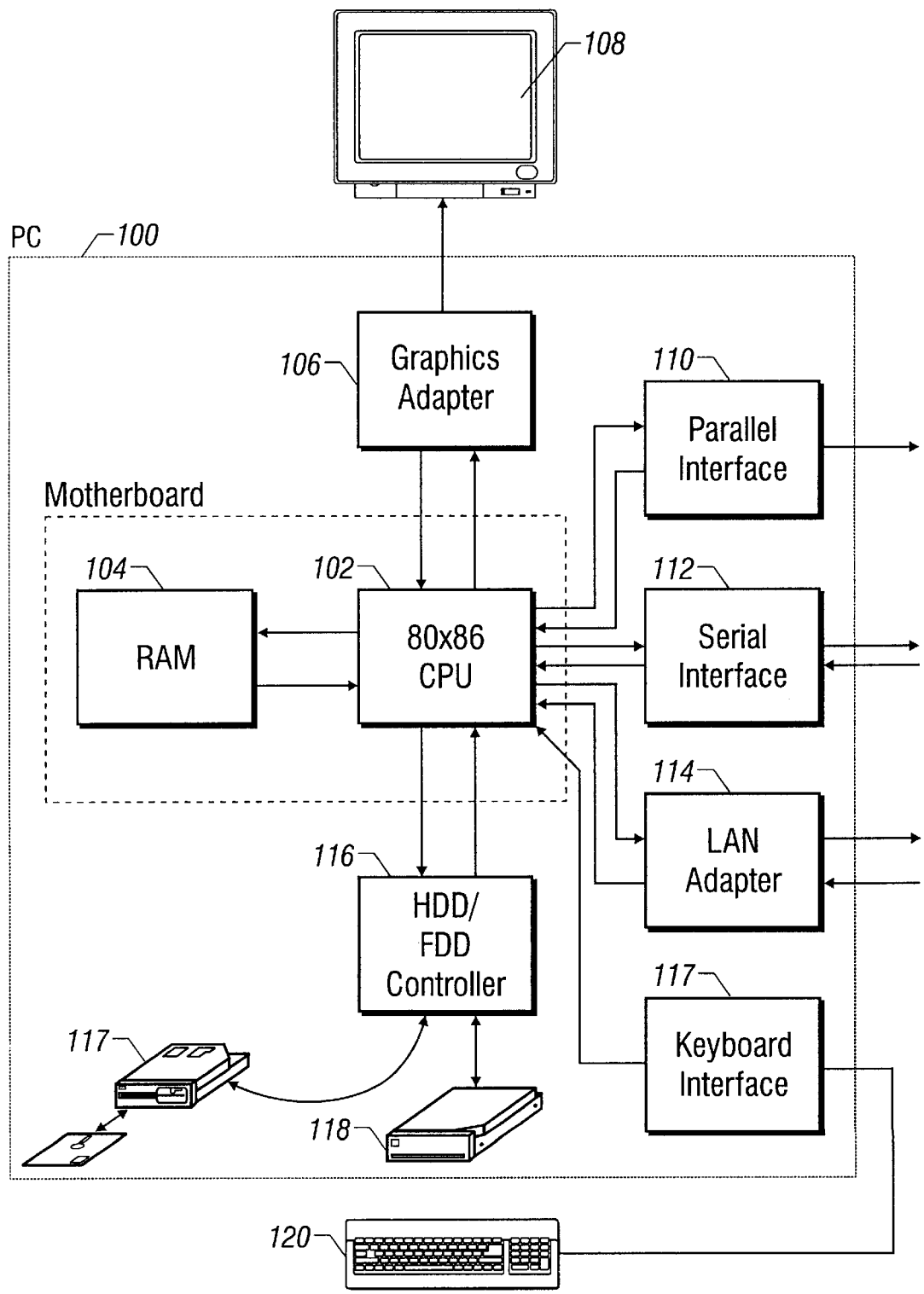
FIG. 1 is a block diagram of a portable computer system in accordance with the present invention.

FIG. 1 illustrates the major components of a typical portable computer. As shown therein, the notebook personal computer 100 has a plurality of components, including a central processing unit (CPU) 102. The CPU 102 is connected to a random access memory (RAM) 104. The CPU 102 is further connected to a graphics adapter 106 for driving a display 108, preferably a liquid crystal display (LCD).

The CPU 102 is also connected to a parallel interface 110, a serial interface 112 and a local area network (LAN) adapter 114. The parallel interface 110 is adapted to control a peripheral with a parallel port such as a laser printer, among others. The serial interface 112 is adapted to drive peripherals with serial ports, such as a modem or a mouse, among others. The LAN adapter 114 is adapted to be connected to a local area network for sharing files with one or more computers.

The CPU 102 is also connected to a hard disk drive and floppy disk drive controller 116. The controller 116, in turn, drives a floppy disk 117 and a hard disk drive 118. Further, the CPU 102 is also connected to a keyboard interface 117. The keyboard interface unit 117, in turn, is connected with a keyboard 120 which is capable of generating electricity for the computer system 100 of FIG. 1.

Figure 2:
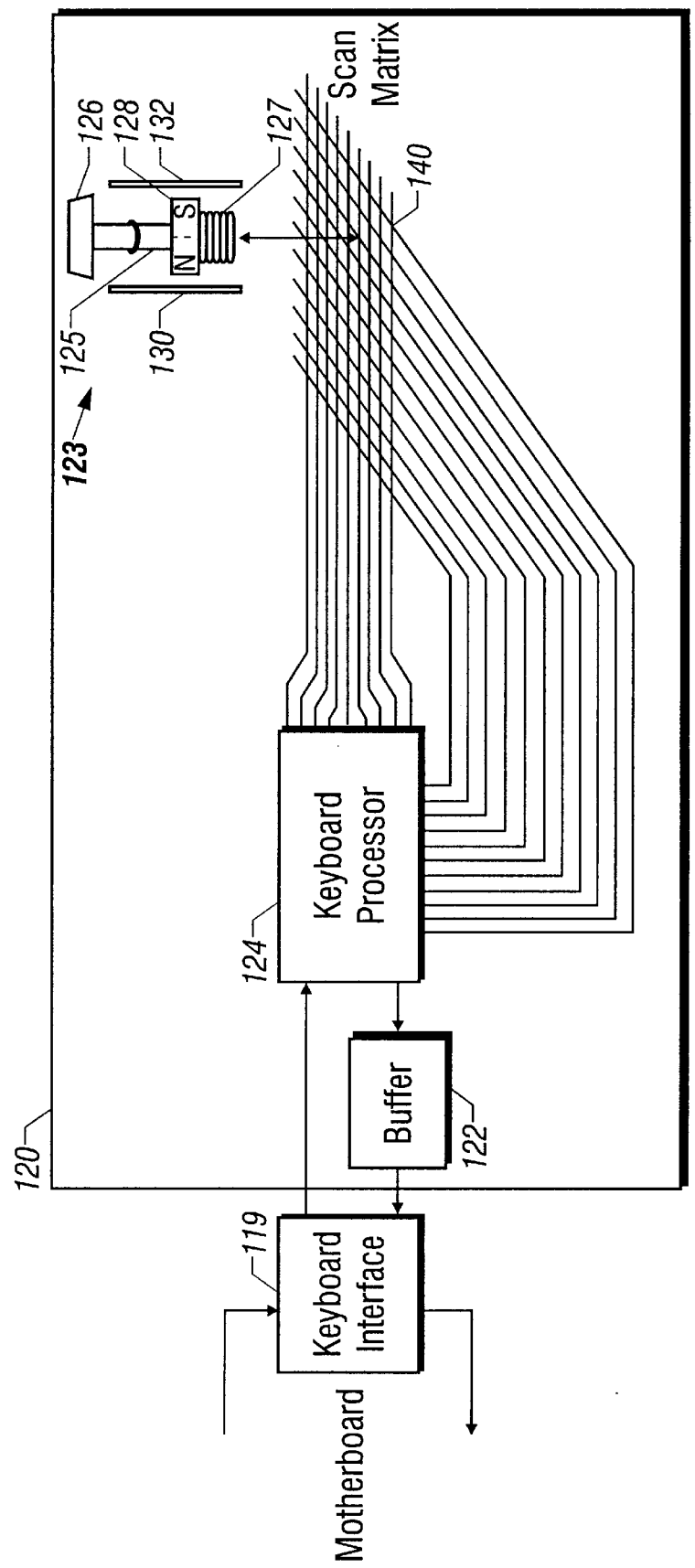
FIG. 2 is a block diagram of the keyboard power generator in accordance with the present invention.

Referring now to FIG. 2, additional details on the keyboard 120 for generating power are illustrated. In FIG. 2, the keyboard 120 is connected to the keyboard interface 119 on the motherboard of FIG. 1. Within the keyboard 120, a keyboard processor 124 receives commands from the keyboard interface 119. The keyboard processor 124 in turn drives a buffer 122 which eventually provides information back to the keyboard interface 119. The keyboard processor 124 is further connected to a scan matrix 140. The scan matrix 140 is made up of crossing lines, each connected to the keyboard processor 124. The crossing lines of the scan matrix 140 are adapted to be shorted together by user actuations at the keys 123.

Each key 123 of the keyboard 120 has a key cap 126. The key cap 126 in turn has a stem 125 having a magnet 128. The key cap 126 is further suspended above the scanned matrix 140 by a spring 127 which provides a return action after a user has depressed the key cap 126. Additionally, coils mounted on printed circuit boards 130 and 132 are positioned adjacent to the ends of the magnet 128. As the key pad 126 is pressed during the typing activity, the magnet 128 moves relative to the coils on the printed circuit boards 130 and 132. Such movement generates a predetermined amount of electricity. As the user types, the energy is captured into a small battery which can power the notebook computer 100 for brief periods. As the small battery is discharged rather than the main battery, the capacity of the main battery is conserved to allow the portable personal computer 100 to operate in an extended manner.

When the user presses a key, the switch 126 closes a contact between the crossing lines of the scanned matrix 140. Based on the shorted crossing lines, the keyboard processor 124 can determine the coordinates of the pressed switch, and therefore the activated key. This is done in the form of a scan code, which is transmitted via the buffer 122 to the keyboard interface 119. In turn, the keyboard interface 119 communicates to the CPU 102 which key has been depressed. Conversion of the scanned coding to the corresponding character is carried out by a program called a keyboard driver. Using this method, different keyboard layouts may be realized without requiring that the keyboard hardware be changed. Therefore, various languages can be realized by simply adjusting the keyboard driver for the language concerned. In this manner, the user can issue commands or generate data to the computer 100 as he or she types on the keyboard 120.

Figure 3:
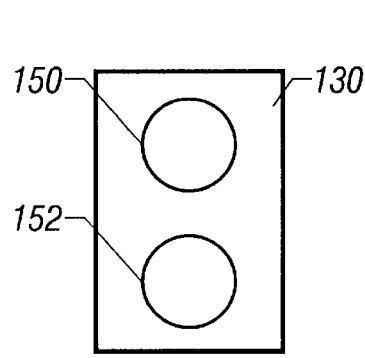
FIG. 3 is an illustration of coils positioned in conjunction with keys of the keyboard of FIG. 2.

The printed circuit board plates 130 or 132 are illustrated in more detail in FIG. 3. As shown therein, the printed circuit board 130 has a plurality of copper coils 150 and 152 etched thereon. These copper coils are positioned at the end of the magnet 128 of FIG. 2 such that, when the magnet 128 traverses over the coils 150 and 152, induced energy in the form of a voltage is observed at the output of the coils 150 and 152. The outputs of a plurality of the circuit boards 130 are summed and multiplied into a charging voltage level, as shown in FIG. 5.

Figure 4:
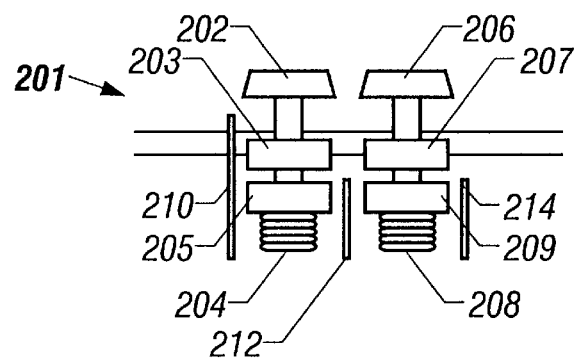
FIG. 4 is an illustration of a second embodiment of the keyboard in accordance with the present invention.

Referring now to FIG. 4, a second embodiment of the present invention is illustrated. In FIG. 4, a plurality of key caps 202 and 206 are mounted on a keyboard 201. Further, each of the key caps 202 and 206 are coupled to magnets 203–205 and 207–209, respectively. The coupling of multiple magnets per each of key caps 202 and 206 increases the voltage output at the coils located on printed circuit boards 210, 212 and 214. In this manner, since keys are typically pressed in a sequence, one coil set can reside between two keys in adjacent printed circuit boards, such as 210 and 212 or 212 and 214, thereby reducing the number of printed circuit boards required. The deployment of magnets 203, 205, 207 and 209 thus enables more energy to be generated by the keyboard power generator of the present invention. The collective output of the keys on the keyboard 201 are multiplied to generate a suitable charging voltage, as illustrated in FIG. 5.

Figure 5:
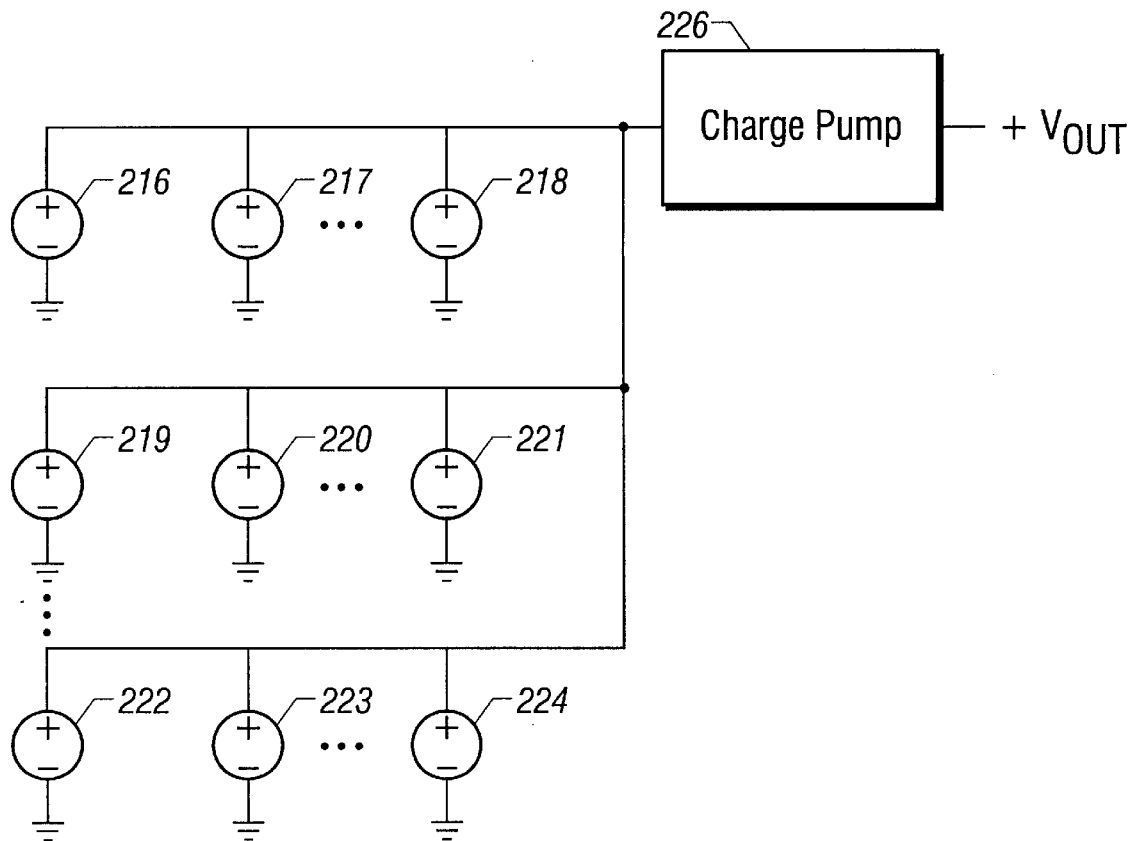
FIG. 5 is a schematic diagram illustrating the electrical connection of voltage generators in the keyboard of the present invention.

Referring now to FIG. 5, the circuitry for amassing energy generated by the keys collectively is shown. As illustrated in FIG. 5, each of the keys is represented as a voltage generator 216–224. The collective voltage outputs from keypad generators 216–224 are provided to a charge pump unit 226. The charge pump 226 in turn increases the small voltage generated by the voltage generators 216–224 to a sufficient level where it can charge a battery.

Figure 6:
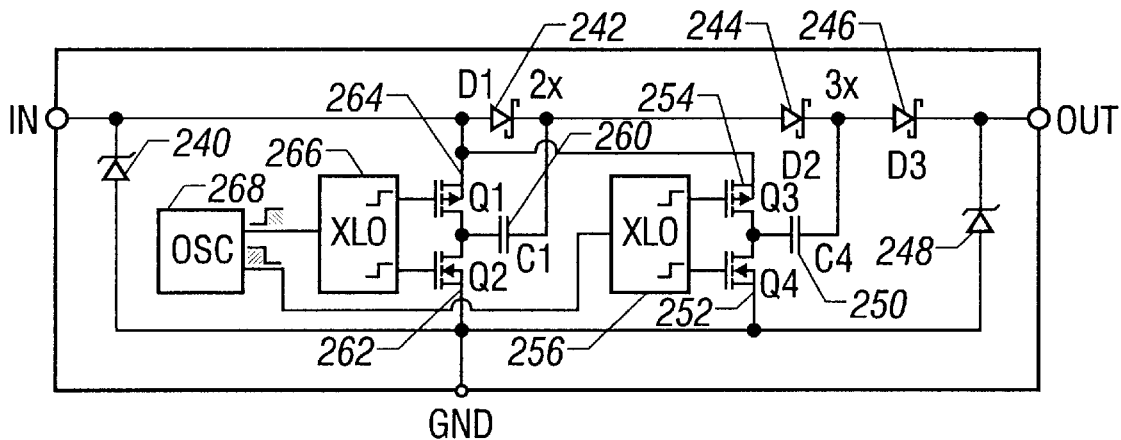
FIG. 6 is an electrical circuit of the charge pump circuitry of FIG. 5.

The charge pump 226 of FIG. 5 is illustrated in more detail in FIG. 6. As shown therein, the charge pump 226 consists of an oscillator 268 and subsequent circuitry to triple the input voltage. The oscillator 268 drives a first crossover lockout (LO) circuit 266 and a second XLO 256. The output of the XLO 266 is provided to a totem pole circuit consisting of a P-channel MOSFET 264 and an N-channel MOSFET 262. One pin of the P-channel MOSFET 264 is connected to one input of a diode 242. The output of the diode 242 is in turn connected to the second pin of the P MOSFET 264 via a capacitor 260. The output of the capacitor 260 is also connected to one pin of the N-channel MOSFET 262, while the other pin of the N-channel MOSFET 262 is connected to ground. A diode 240 is connected between the input to the diode D1 and ground. In this manner, the diode D1 generates a voltage that is twice the input voltage.

The second output of the oscillator 268 drives a second XLO 256 in a similar manner. In this multiplier stage, the output of the XLO 256 drives a P-channel MOSFET 254 and an N-channel MOSFET 252. Further, the P-channel transistor 254 and N-channel transistor 252 are connected together via a capacitor 250. The other input of the capacitor 250 is connected to the output of a diode 244. The input of the diode 244 is connected to output of the diode 242. Further, the output of the diode 244 is connected to the input of a diode 246. The output of the diode 246 in turn is connected to the output of a diode 248, whose input is connected to ground. The output of the diode 246 is a voltage that is greater than the voltage at the N-terminal.

In FIG. 6, the voltage step-up is performed by charging the capacitor 260, and then switching the charged capacitor 260 in series with the input voltage to produce a higher voltage at the output of the diode 242. By switching the MOSFET transistors 264 and 262, the output of the diode 242 becomes nominally twice the input voltage IN. The same operation is performed at the output of the diode 244 to produce a tripled voltage. Thus, the charge pump of FIG. 6 produces an output that is a multiple of the input voltage. The multiplied voltage available at the OUT terminal of FIG. 6 is used to charge a small battery, as further shown in FIG. 7.

Figure 7:
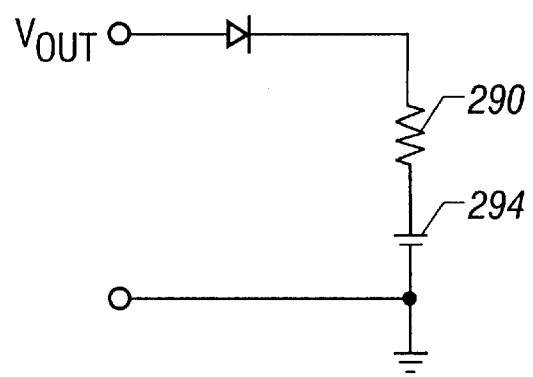
FIG. 7 is an electrical diagram illustrating the trickle charge circuitry of the present invention.

Turning now to FIG. 7, a trickle-charge circuit for charging the battery of the present invention is shown in detail. In FIG. 7, the output of the voltage multiplier of FIG. 6 is provided to a diode 280. The output of the diode 280 is provided to a resistor 290. The resistor 290 is further connected to the battery 294 which stores the energy produced by the key strokes for eventual usage by the personal computer 100. In this manner, the more information entered by the user, the more electricity is generated by the keyboard power generator. The energy provided by the keyboard of the present invention can then be used to lengthen the operating period of the portable computer, or alternative, can be used to reduce the size of the primary battery so as to result in a lighter portable computer. Thus, the present invention allows longer operating period between recharge, faster processing speeds, more powerful peripherals, larger screens and other advanced features for portable computers while keeping weight and size down.

Although a relatively simple, yet robust trickle-charge circuitry is used in FIG. 7, the present invention contemplates that more complex battery charger controllers such as a MAX712 or a MAX713, available from Maxim Integrated Products, Inc. in Sunnyvale, Calif., may be utilized. These devices may perform fast charge of the batteries based on the voltage slope, temperature and timer of fast charge cut-off. Further, these controllers may be able to charge the battery in a linear mode while supplying the battery's load as necessary.

In sum, as discussed above, when the magnets mounted on the keys traverse the series of coils mounted on both ends of the magnet during the typing session, voltage outputs are generated at the output of the coils. The currents generated collectively by the keys are provided to the charge pump which multiplies the voltage to achieve a level greater than the voltage level of the battery to he charged. The multiplied voltage is provided to a charging circuitry such as a trickle charger to recharge the battery. In this manner, the more information entered by the user, the more electricity is generated by the keyboard power generator. The energy provided by the keyboard of the present invention can be used to lengthen the operating period of the portable computer, or in the alternative, can be used to reduce the size of the primary battery so as to result in a lighter portable computer. Thus, the present invention allows longer operating period between recharge, faster processing speeds, more powerful peripherals, larger screens and other advanced features for portable computers while keeping weight and size down.

The general system configuration of the present invention discloses one possible implementation of the present invention for the display, navigation, manipulation and editing of text and image data in a graphical user interface. As will be described, the general system configuration describes a computer display system which may be in the form of a personal computer, workstation, or dedicated processor system to permit the user to utilize the teachings of the present invention. No particular computer hardware is described within this specification, and the general system configuration description is intended to encompass a broad range of possible data processing systems in which the present invention may be implemented.

It will be appreciated that a variety of other energy generating mechanisms can be used with the keyboard 120. For example, piezoelectric sources could be used as the mechanical to electrical energy converter, as could other capacitive or inductive methods. Further, a power supply could provide computer power directly from the energy provided, or could charge the battery directly. While this power source is especially applicable to portable computers, it can be used to augment the power in other computers, such as desktops, as well.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A method for capturing energy from a keyboard, having a plurality of keys, each of said keys having a magnet mounted thereon, each of said keys further positioned between one or more coils, comprising:

actuating said key to move said magnet over said coils;

providing energy generated by moving said keys over said coils to a charge pump circuit; and storing said energy into a voltage storage device, said energy usable as at least a portion of a power source.

2. The method of claim 1, further comprising the step of operating a computer temporarily from the output of said voltage storage device.

3. The method of claim 1, wherein said voltage storage device is a capacitor.

4. The method of claim 1, wherein said voltage storage device is a battery.

5. The method of claim 1, further comprising the step of scanning a matrix to detect a key actuation.

6. The method of claim 5, further comprising the step of operating said computer based on said key actuations.

7. The method of claim 1, further comprising:

stepping-up the voltage of said collected voltage from said keys; and charging a voltage storage device with said stepped-up voltage.

8. The method of claim 7, wherein said charging step is a trickle charging step.

9. The method of claim 7, wherein said charging step is a fast charging step.

10. The method of claim 1, further comprising a second magnet coupled to said stem, further comprising:

actuating said key to move said magnets over said coils;

providing energy generated by moving said key over said coils to a charge pump circuit; and storing said energy into a voltage storage device.

11. A computer system, comprising:

a processor;

a memory coupled to said processor;

a display device coupled to said processor;

a data storage device coupled to said processor;

an energy storage device coupled to said processor, said memory, said display device, and said data storage device for providing power; and a keyboard coupled to said processor and to said energy storage device, including:

a key cap having a stem;

a magnet coupled to said stem; and one or more coils positioned on either side of said magnets for generating energy when said key cap is moved by said user, at least one of said coils generating said energy, said energy transmitted to said energy storage device for providing additional power.

12. The computer system of claim 11, wherein said coils are mounted on one or more printed circuit boards.

13. The computer system of claim 11, wherein said key caps are positioned above a scan matrix.

14. The computer system of claim 11, further comprising a scan matrix and a keyboard processor, said keyboard processor receiving closures on said scan matrix by said key.

15. The computer system of claim 14, further comprising a keyboard interface for communicating with said keyboard processor.

16. The computer system of claim 11, further comprising a spring positioned at the bottom of said stem.

17. The computer system of claim 11, further comprising a second magnet mounted on said stem.

18. The computer system of claim 11, further comprising a charge pump coupled to said coils.

19. The computer system of claim 11, further comprising a battery charger coupled to said battery.

20. The computer system of claim 19, wherein said battery charger is a trickle charge circuit.

21. A system for providing extended battery life, the system comprising:

a keyboard, the keyboard including:

a plurality of keys; and a mechanical to electrical energy converter coupled to at least one of the plurality of keys, the mechanical to electrical energy converter providing an electrical signal containing power in response to mechanical activation of at least one of the plurality of keys;

a power supply receiving the electrical signal and providing usable power drawn from the electrical signal; and a computer coupled to the keyboard and the power supply and using the usable power as at least a portion of the computer power source.

22. The system of claim 21, wherein the computer includes:

battery terminals for a battery; and a battery charger receiving the usable power as a power source and charging the battery with the usable power.

23. The system of claim 21, wherein the computer includes:

a processor, wherein the processor is powered at least in part by the power supply.

* * * * *